(12) United States Patent
Bulaga et al.

(10) Patent No.: US 6,549,150 B1
(45) Date of Patent: Apr. 15, 2003

(54) INTEGRATED TEST STRUCTURE AND METHOD FOR VERIFICATION OF MICROELECTRONIC DEVICES

(75) Inventors: Raymond J. Bulaga, Richmond, VT (US); John K. Masi, Milton, VT (US); Patrick W. Miller, Winooski, VT (US); Mark S. Styduhar, Hinesburg, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,536

(22) Filed: Sep. 17, 2001

(51) Int. Cl.[7] .................................................. H03M 1/10
(52) U.S. Cl. ....................................... 341/120; 341/118
(58) Field of Search ................................. 341/120, 144, 341/118

(56) References Cited

U.S. PATENT DOCUMENTS

| | | | |
|---|---|---|---|
| 4,183,016 A | | 1/1980 | Sawagata |
| 4,641,246 A | | 2/1987 | Halbert et al. |
| 4,893,124 A | | 1/1990 | Tsuji et al. |
| 5,247,301 A | | 9/1993 | Yahagi et al. |
| 5,760,730 A | | 6/1998 | Fischer et al. |
| 5,870,042 A | * | 2/1999 | Noda .......................... 341/120 |
| 6,229,465 B1 | * | 5/2001 | Bulaga et al. ............... 341/120 |
| 6,320,528 B1 | * | 11/2001 | Michel ........................ 341/144 |

OTHER PUBLICATIONS

IBM Technical Disclosure Bulletin, vol. 23, No. 3, Aug. 1980, Programmable Gain Amplifier Automatic Tester, pp. 1063–1064.
IBM Technical Disclosure Bulletin, vol. 12, No. 10, Mar. 1970, "Analog–To–Digital Pulse Converter", pp. 1541–1542.

* cited by examiner

Primary Examiner—Peguy JeanPierre
Assistant Examiner—Joseph Lauture
(74) Attorney, Agent, or Firm—Schmeiser, Olsen & Watts; Robert A. Walsh

(57) ABSTRACT

An integrated test structure adapted to facilitate manufacturing verification of microelectronic devices such as Digital to Analog Converters (DAC) is disclosed. The test circuitry and the Circuit Under Test (CUT) are placed on an IC along with an arbitrary amount of digital logic, which drives the input of the CUT. These inputs are translated into an analog output. During a manufacturing test, this output is measured in order to determine that the IC has been manufactured correctly. The analog input of the circuit is coupled to the analog output of the DAC. The digital output of the test circuitry is coupled to the digital logic on the IC. This configuration comprises a Built In Self Test (BIST) structure. The invention allows BIST by eliminating the need to measure the analog output of the DAC external to the IC, and enables testing the CUT by using standard digital BIST techniques.

22 Claims, 12 Drawing Sheets

| INPUT | C20 OFF | C22 OFF | C20-OUT | C22-OUT |
|---|---|---|---|---|
| 0 | 0.5 | 1.5 | 1 | 0 |
| 1 | 0.5 | 1.5 | 0 | 0 |
| 2 | 1.5 | 2.5 | 0 | 0 |
| 3 | 2.5 | 3.5 | 0 | 0 |
| 4 | 3.5 | 4.5 | 0 | 0 |
| 5 | 4.5 | 5.5 | 0 | 0 |
| 6 | 5.5 | 6.5 | 0 | 0 |
| 7 | 6.5 | 7.5 | 0 | 0 |
| 8 | 7.5 | 8.5 | 0 | 0 |
| 9 | 8.5 | 9.5 | 0 | 0 |
| 10 | 9.5 | 10.5 | 0 | 0 |
| 11 | 10.5 | 11.5 | 0 | 0 |
| 12 | 11.5 | 12.5 | 0 | 0 |
| 13 | 12.5 | 13.5 | 0 | 0 |
| 14 | 13.5 | 14.5 | 0 | 0 |
| 15 | 14.5 | 15.5 | 0 | 0 |

FIG. 5

| INPUT | C20 OFF | C22 OFF | C20-OUT | C22-OUT |
|---|---|---|---|---|
| 0 | 0.5 | 1.5 | 1 | 0 |
| 1 | 0.5 | 1.5 | 0 | 0 |
| 2 | 1.5 | 2.5 | 0 | 0 |
| 3 | 2.5 | 3.5 | 0 | 0 |
| 4 | 3.5 | 4.5 | 0 | 0 |
| 5 | 4.5 | 5.5 | 0 | 0 |
| 5.4 | 5.5 | 6.5 | 1 | 0 |
| 7 | 5.9 | 6.9 | 0 | 1 |
| 8 | 7.5 | 8.5 | 0 | 0 |
| 9 | 8.5 | 9.5 | 0 | 0 |
| 10 | 9.5 | 10.5 | 0 | 0 |
| 11 | 10.5 | 11.5 | 0 | 0 |
| 12 | 11.5 | 12.5 | 0 | 0 |
| 13 | 12.5 | 13.5 | 0 | 0 |
| 14 | 13.5 | 14.5 | 0 | 0 |
| 15 | 14.5 | 15.5 | 0 | 0 |

INTEGRATED TEST STRUCTURE AND METHOD FOR VERIFICATION OF MICROELECTRONIC DEVICES

BACKGROUND OF THE INVENTION

1. Technical Field

This invention generally relates to the testing of digital to analog converters, and more specifically relates to a test structure and method for testing digital to analog converters using on-chip components.

2. Background Art

A digital to analog converter, or DAC, is used wherever it is necessary to convert a digitally processed signal into a continuous output signal. As is clear from its name, a DAC accepts an input in digital form and converts it to the analog signal seen at the output of the DAC. During the manufacturing process a DAC is tested in various ways to ensure that its performance meets acceptable standards. The particular tests applied to a DAC are determined according to its target application and manufacturing cost considerations. Generally speaking, DACs targeted for higher performance applications can tolerate a higher manufacturing cost, and thus a more extensive testing process, because they have a higher selling price. Market pressures, however, are driving costs downward while elevating performance expectations, thus increasing the need for efficient and inexpensive testing methods.

There are two basic categories of DAC tests, namely static, or direct current (DC) tests, and dynamic, or alternating current (AC) tests. Dynamic testing requires specialized equipment and is usually reserved for high performance DACs. Static testing, on the other hand, can usually be accomplished without specialized tester resources and can be done instead using a test resource known as a parametric measurement unit (PMU) that is available on virtually any manufacturing test system. A DAC's offset, gain, and linearity will conventionally be tested.

Offset is measured by conditioning the digital input of the DAC with a signal, such as an input code, intended to result in a minimum analog output voltage. The word code herein also includes a signal of any kind that may be input to a device. A tester PMU is then used to measure the analog output which is then compared, via the test program software, to a predefined pass/fail limit, sometimes referred to as the zero code. The parameter measured by the test program software is sometimes referred to as zero code error (ZCE). Gain is measured in a similar manner. The digital input is conditioned with a signal, such as a code, intended to result in a maximum analog output voltage. The PMU is used to measure the actual analog output. The test program then processes the result to obtain the gain.

Linearity tests are based on the assumption that each DAC input code results in a unique analog output. The conversion function is such that increasing values of input code result in linearly increasing values of output code. Although not every DAC design fits this pattern, the vast majority manufactured today do fall into this category. The most frequently applied linearity tests are for differential non-linearity (DNL) and integral non-linearity (INL).

DNL can be understood as the difference between the ideal and the actual analog step size between successive binary input codes. For example, if a binary input code of 01 ideally results in an analog output of 1.0 and a binary input code of 10 ideally results in an analog output code of 2.0, then the ideal step size is 1.0 (i.e., 2.0–1.0). The DNL test at this code consists of measuring the actual analog outputs resulting from these two binary input codes and subtracting them. Ideally, the difference should be 1.0. If the difference is 1.2, then the DNL error is 0.2. In practice, this value is compared to a predefined pass/fail limit by the test program software.

INL can be understood as the worst case deviation from a linear response. This parameter is evaluated across all of the possible digital input to analog output combinations. There are a number of ways to test this in manufacturing. The data acquisition method is conventionally the same as that used for DNL. The main difference between the two is the calculations made by the test program after the data are collected. In real world practice, DNL and INL calculations are often based on a subset of all possible conversion values, to save manufacturing costs.

A current methodology for performing the various DAC tests described above is based on the design of a Video DAC (VDAC) core, which allows placing the circuit into a special test mode where the VDAC generates its own digital input pattern. This pattern is incremented by a digital clock supplied by the test system. The measurement technique is the same as described above. The analog outputs of the VDAC are measured using the tester PMU.

A VDAC is constructed as a bank of current switches. In operation, the output current is derived by summing a number of individual current sources into a single output node. The individual current sources are designed to have different output values. The actual values are multiples of something known as the Least Significant Bit (LSB). This is the finest resolution the converter can achieve. The current sources have values of 1, 2, 4, and 8 LSBs. The actual value of current supplied by each current source is determined by a reference current generator built into the VDAC core design. The reference current is defined by the value of a resistor that is separate from the IC containing the VDAC. This resistor doesn't exist in the standard IC test environment. To alleviate the need for custom test interface hardware that includes the resistor, the VDAC is designed to contain an internal resistor that is used only during testing to supply the required current source reference during manufacturing test. This resistor is sensitive to manufacturing process variations.

The test procedure described above accomplishes manufacturing test goals by verifying that all of the VDAC current sources are operational, dynamically accounting for process variations in the "test only" reference resistor. The test also verifies DC gain and offset accuracy, and provides an effective screen against non-linearities associated with manufacturing process defects.

The current testing methodology described in the foregoing paragraphs requires a separate test resource such as a PMU to make the needed measurements. This requirement leads to several drawbacks in and complications of the testing process. The most obvious of these may be the fact that a test resource embodied in a separate piece of equipment must first be located and then physically brought to the test site and coupled to the device being tested. Further, testing with an external resource is relatively slow and inefficient, and limits the types of tests that may be performed.

SUMMARY OF THE INVENTION

Therefore, there existed a need to provide a DAC manufacturing test resource that overcomes the problems of the current solutions by increasing the speed and accuracy with which a manufacturing test may be performed, increasing the available types of tests that may be run, and providing access to internal nodes that are not accessible to an external tester resource. According to the present invention, a DAC is part of an integrated circuit (IC) that includes digital logic. The digital logic includes the combinational and sequential control required to facilitate Built In Self Test (BIST) of the type previously employed in other solutions. The digital logic is presumed to drive the input of the DAC, which consists of a number of digital signals. These inputs are translated, as a function of the DAC design, into an analog output. During manufacturing test, this analog output is measured in order to determine that the IC has been manufactured correctly.

The circuitry of the present invention is connected between the DAC output and the digital logic on the IC. The analog input of the test circuitry is coupled to the analog output of the DAC. The two digital outputs of the test circuitry are coupled to the digital logic on the IC. This configuration comprises a BIST structure. The invention allows a BIST by eliminating the need to measure the analog output of the DAC external to the IC.

The circuit of the present invention is connected between the DAC and the digital logic on an IC, and may comprise a sample and hold (S/H) circuit, a sample and hold (S/H) clock, a latch clock, and two comparators with differing internal offsets, with the offsets selected based primarily on the DNL specification for the DAC. In one embodiment of the invention, the offsets are different multiples of the difference between a predicted output voltage of the DAC at a first time T1 and at a second time T2. The predicted output signals or voltages may differ from the actual output voltages produced when an input of the DAC is stimulated with a code intended to produce the predicted output voltage. The words signal, voltage, and code are used interchangeably herein.

In one embodiment of the invention, the testing method comprises the steps of: (1) sampling and holding a first actual output signal or voltage of the microelectronic device being tested, where the first actual output signal is representative of an output of said microelectronic device at a first time T1; (2) stimulating the device being tested causing the actual output signal or voltage of the microelectronic device to be updated to a second actual output signal representative of an output of said microelectronic device at a second time T2; (3) comparing the first and second output signals; and (4) returning a status signal indicative of the performance of the microelectronic device.

In a particular embodiment of the invention, a manufacturing test is performed by running a series of test cycles wherein each test cycle includes the following steps: The number of test cycles included in a test is arbitrary, and may vary from one manufacturing test to another. The first step in each test cycle conventionally involves stimulating the inputs of a DAC with a code intended to produce a predicted output signal. The DAC actual output signal is then sent to the comparators described herein, which compare the first actual output signal with the second actual output signal. The comparators contain a fixed internal offset, as will be further described in connection with FIG. 4, and return a signal indicative of the performance of the DAC. The digital outputs of the comparators are sampled using standard digital latches.

Because the circuit of the present invention is entirely contained on the IC, there is no need for a PMU or any other tester resource to make the measurements. This allows the test to run significantly faster, reducing manufacturing test costs. Faster testing also allows testing more codes, which may improve test quality, and provides intrinsic AC test coverage: if the DAC doesn't respond fast enough then it will fail the test. The on-chip location of the present invention further provides access to internal IC nodes that are not available at the IO pins. In addition, both low and high limits are set simultaneously rather than separately as in some previous solutions, thus saving time and expense. Front End Hardware (FEH) noise issues are also minimized or eliminated.

The foregoing and other features and advantages of the invention will be apparent from the following more particular description of specific embodiments of the invention, as illustrated in the accompanying drawings.

BRIEF DESCRIPTION OF THE OF THE DRAWINGS

Specific embodiments of the present invention will hereinafter be described in conjunction with the appended drawings, where like designations denote like elements:

FIG. 5 is a table listing comparator output values corresponding to the FIG. 4 graph;

FIG. 7 is a table listing comparator values corresponding to the graph in FIG. 6;

MODES FOR CARRYING OUT THE INVENTION

The present invention is an integrated test structure adapted to facilitate and speed manufacturing verification of microelectronic devices containing analog or mixed signal circuitry, such as a DAC. According to an embodiment of the present invention, test circuitry and a DAC are placed on an integrated circuit along with digital logic, which is presumed to drive the input of the DAC. The digital logic includes the combinational and sequential control required to facilitate Built In Self Test (BIST) of the type previously employed in other solutions. These inputs are translated, as a function of the DAC design, into an analog output. During manufacturing test, this analog output is measured in order to determine that the IC has been manufactured correctly. The analog input of the test circuitry is coupled to the analog output of the DAC. The digital output of the test circuitry is coupled to the digital logic on the IC. This configuration comprises a BIST structure. The invention allows a BIST by eliminating the need to measure the analog output of the DAC external to the IC.

Figure 1:
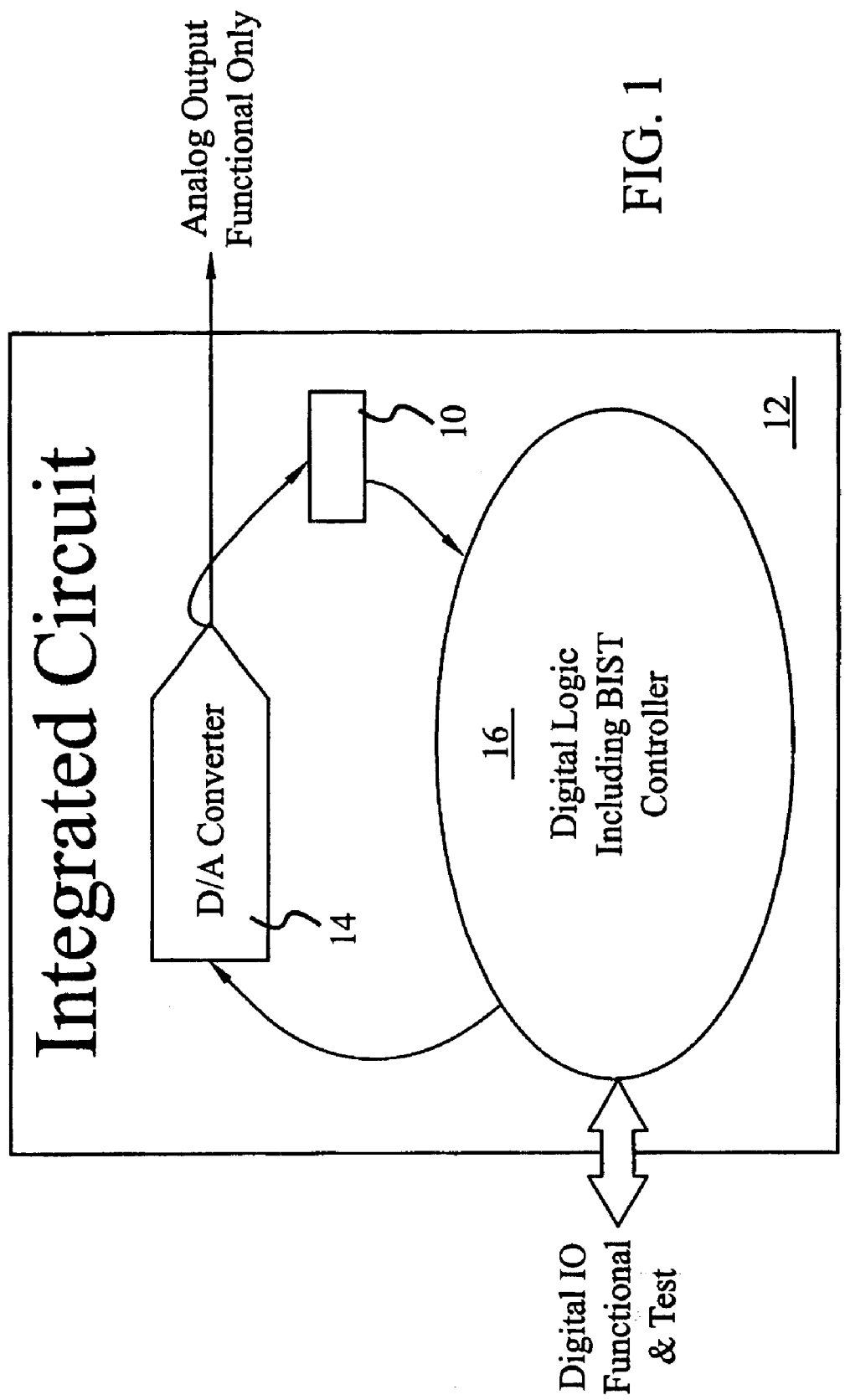
FIG. 1 is a block diagram of an integrated circuit configured according to one or more embodiments of the present invention.
Figure 2:
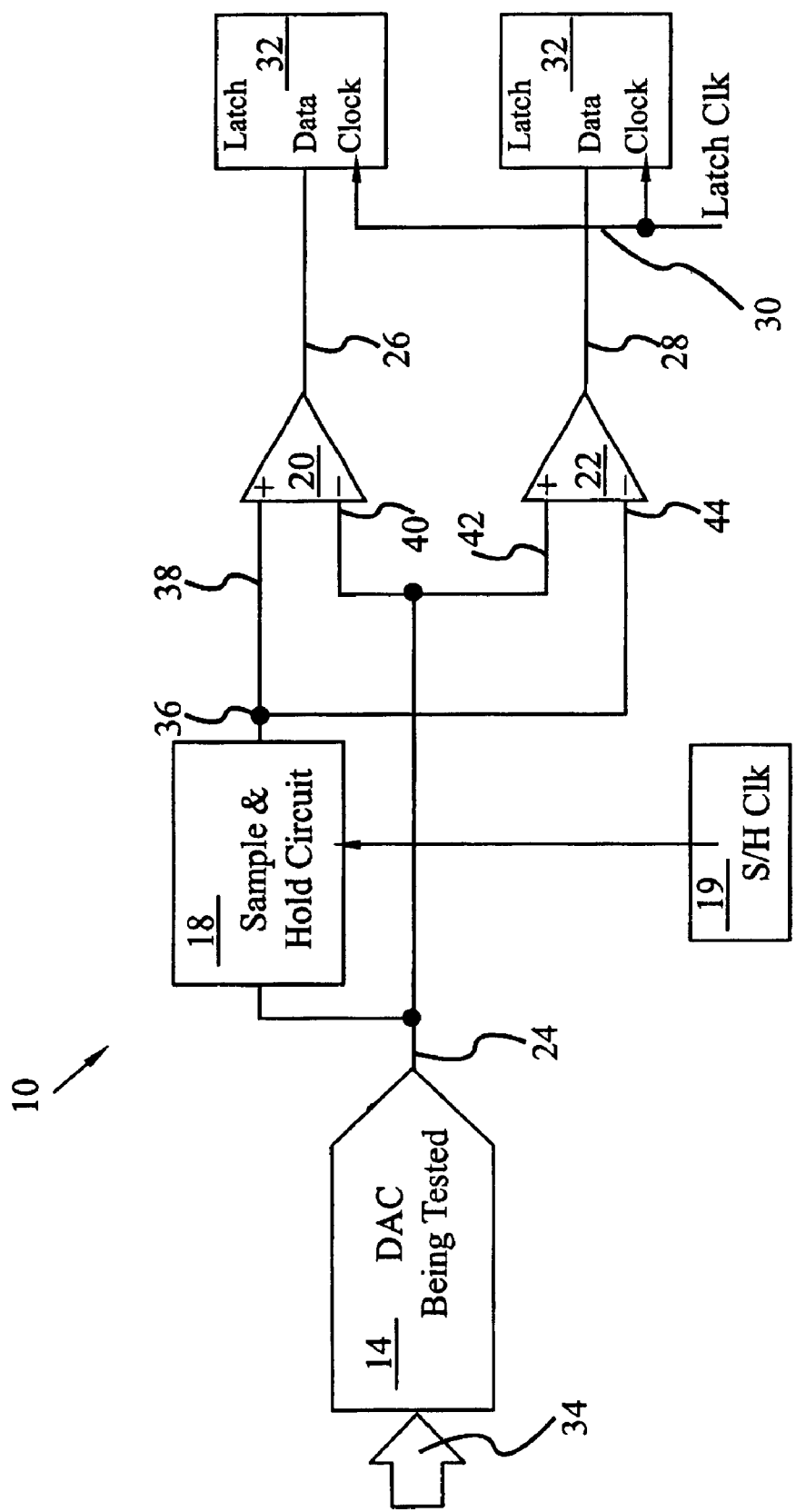
FIG. 2 is a block diagram of an embodiment of the present invention.

Referring now to the figures, and in particular to FIGS. 1 and 2, an integrated test structure 10 is located on an integrated circuit (IC) 12. Integrated circuit 12 also comprises a Digital to Analog Converter (DAC) 14 and digital logic 16. Integrated test structure 10 comprises a sample and hold circuit 18, a sample and hold clock 19, a first comparator 20, and a second comparator 22, each with fixed internal offsets. In one embodiment of the invention, a third comparator, not shown, with fixed internal offset may be included to enable increased resolution of the measurements. Additional comparators beyond three may also be included to further increase the resolution of the measurements. Test structure 10 further includes an analog input 24, a first digital output 26, and a second digital output 28. A latch clock 30 of test structure 10 may connect with at least one sequential storage element 32.

Digital input 34 of DAC 14 is, in one embodiment of the invention, driven by digital logic 16 on IC 12.

Digital logic 16 includes the combinational and sequential control required to facilitate Built In Self Test (BIST) of a type well known in the art. A conventional DAC has a number of digital inputs 34, which DAC 14 converts into an analog output. This output is analog input 24: the analog value output by DAC 14 may be input into test structure 10, where it is analyzed as described herein.

First and second digital outputs 26 and 28 are coupled to digital logic 16 on IC 12. This configuration comprises a BIST structure. Test structure 10 allows BIST by eliminating the need to measure analog input 24 external to IC 12. This improves the manufacturing testing of DAC 14 in a variety of ways, including increased accuracy and speed, as will be described below.

The manner in which sample and hold clock 19, latch clock 30, and digital inputs 34 to DAC 14 are generated is well known, and one of ordinary skill in the art will be aware of a number of techniques for doing so, any one of which may be used in conjunction with the present invention. In one embodiment of the present invention, these events may occur sequentially in the following order: DAC 14 update; latch clock 30; and sample and hold clock 19.

In one embodiment of the invention, the testing method comprises the following steps. A first output signal of DAC 14, or other microelectronic device being tested, is sampled and held. This may be accomplished by sample and hold circuit 18, or by any other device or method suitable for storing an analog signal on a microelectronic device. The first actual output signal is sampled at analog input 24, and is representative of an output of DAC 14 at a first time T1.

A second actual output signal of DAC 14 is then generated, also at analog input 24, representative of an output of DAC 14 at a second time T2. The first and second output signals are compared to see if they fall within a pre-determined range, as dictated by the internal offset of the comparators. Finally, test structure 10 returns, as digital outputs 26 and 28, a status signal indicative of the performance of DAC 14.

More specifically, digital outputs 26 and 28 may return a zero or pass reading if the first and second output signals fall within a pre-determined range of each other. Said another way, digital outputs 26 and 28 may return a zero or pass reading if the actual output signals are within a pre-determined amount of the predicted output signals. Furthermore, digital outputs 26 and 28 represent the relationship of analog input 24 sampled and held at time T1 to the updated analog input 24 at time T2.

In a particular embodiment of test structure 10, a manufacturing test is performed by running a series of test cycles wherein each test cycle includes the steps described below. The number of test cycles included in a test is arbitrary, and may vary from one manufacturing test to another. The first step in each test cycle conventionally involves stimulating inputs 34 of DAC 14 with a code intended to produce a predicted output voltage. The actual output voltage of DAC 14 is then sent to comparators 20 and 22, which compare the first actual output voltage of DAC 14 with the second actual output voltage of DAC 14. Comparators 20 and 22 have built in offsets at the plus (+) and minus (−) inputs, respectively, as will be further described below, and output a voltage at digital outputs 26 and 28 indicative of the performance of DAC 14. Digital outputs 26 and 28 of comparators 20 and 22 are sampled using standard digital latches 32.

Sample and hold circuit 18 may be level sensitive. In other words, sample and hold circuit 18 "samples" when sample and hold clock 19 is active; at other times, it "holds." During sampling, the analog value on the input 24 of sample and hold circuit 18 is passed to an output 36 of sample and hold circuit 18. During holding, output 36 of sample and hold circuit 18 remains equal to the last previously sampled analog input 24.

Comparators 20 and 22, in at least one embodiment, are not latched, and may be constructed with offsets, as follows. First comparator 20 may be constructed so that a first plus (+) input 38 has an internal offset 0.5 times the value of the step size being detected. This multiplier is based on the desired test performance, primarily the DNL specification for DAC 14. First comparator 20 also has a first minus (−) input 40. The offsets of comparators 20 and 22 are added to the values detected at the appropriate inputs of the comparators. Thus, for example, if the step size is one, and the value at input 38 of first comparator 20, the 0.5 offset results in a value at input 38 of 1.5.

Figure 3:
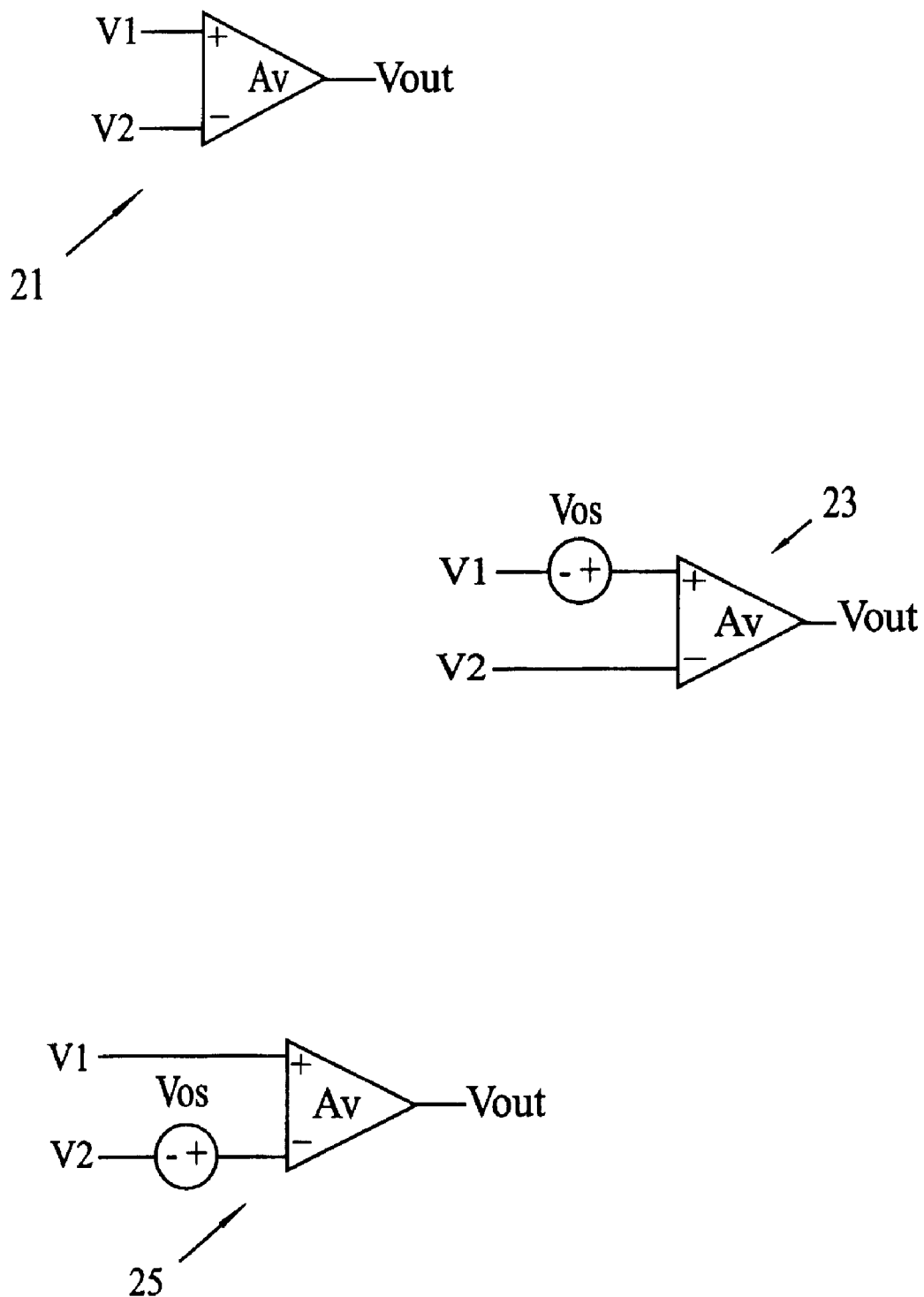
FIG. 3 is a symbolic representation of comparators configured according to an embodiment of the present invention.

Referring now to FIG. 3, the operation of comparators, including comparators with an internal offset, will be further explained. Specifically, the operation of the comparators, including the concept of an internally applied offset voltage, will be described in mathematical terms. For each of the three comparators shown, V1 is the signal connected to the plus (+) input, and V2 is the signal connected to the minus (−) input. Av is the voltage gain of the comparator circuit. Vout is the output signal of the comparator. Comparator 21 represents a comparator with no internal offset. The voltage transfer function is Vout=Av(V1−V2). If (V1−V2) is positive, Vout will be a logic 1, or high. If (V1−V2) is negative, Vout will be a logic 0, or low.

Comparator 23 is a comparator with an internal offset voltage at the plus (+) input. First comparator 20 of the present invention is of this type. Vos is an offset voltage internal to comparator 23. The voltage transfer function is Vout=Av[(V1+Vos)−V2]. If [(V1+Vos)−V2] is positive, Vout will be a logic 1, or high. If [(V1+Vos)−V2] is negative, Vout will be a logic 0, or low.

Referring still to FIG. 3, comparator 25 is a comparator with an internal offset voltage at the minus (−) input, and corresponds to second comparator 22 of the present invention. Vos is an offset voltage internal to comparator 25. Here, the voltage transfer function is Vout=Av[V1−(V2+Vos)]. If [V1−(V2+Vos)] is positive, Vout will be a logic 1, or high. If [V1−(V2+Vos)] is negative, Vout will be a logic 0, or low.

Second comparator 22 may be constructed so that a second minus (−) input 44 has an internal offset 1.5 times the value of the step size being detected. The step size in many of the examples herein will be equal to one, although other step sizes are certainly possible. As with first comparator 20, this multiplier is based on the desired test performance, and in particular the DNL specification for DAC 14. Thus, as will be readily apparent to those of ordinary skill in the art, fixed offsets of other values may also be used for both comparators 20 and 22. Second comparator 22 also has a second plus (+) input 42. Digital outputs 26 and 28 of comparators 20 and 22 are sampled via standard digital latches 32. The output of latches 32 are fed back to the BIST logic 16 on IC 12.

The actual operation of integrated test structure 10 may be understood by considering the waveforms at inputs 38, 40, 42, and 44 of comparators 20 and 22, with the comparator internal offsets included. These waveforms are shown graphically in FIG. 4 and tabulated in FIG. 5, where column C20-OUT represents the output of comparator 20 and where column C22-OUT represents the output of comparator 22. These outputs are interpreted by BIST logic 16 to determine the pass/fail status of each test.

Figure 4:
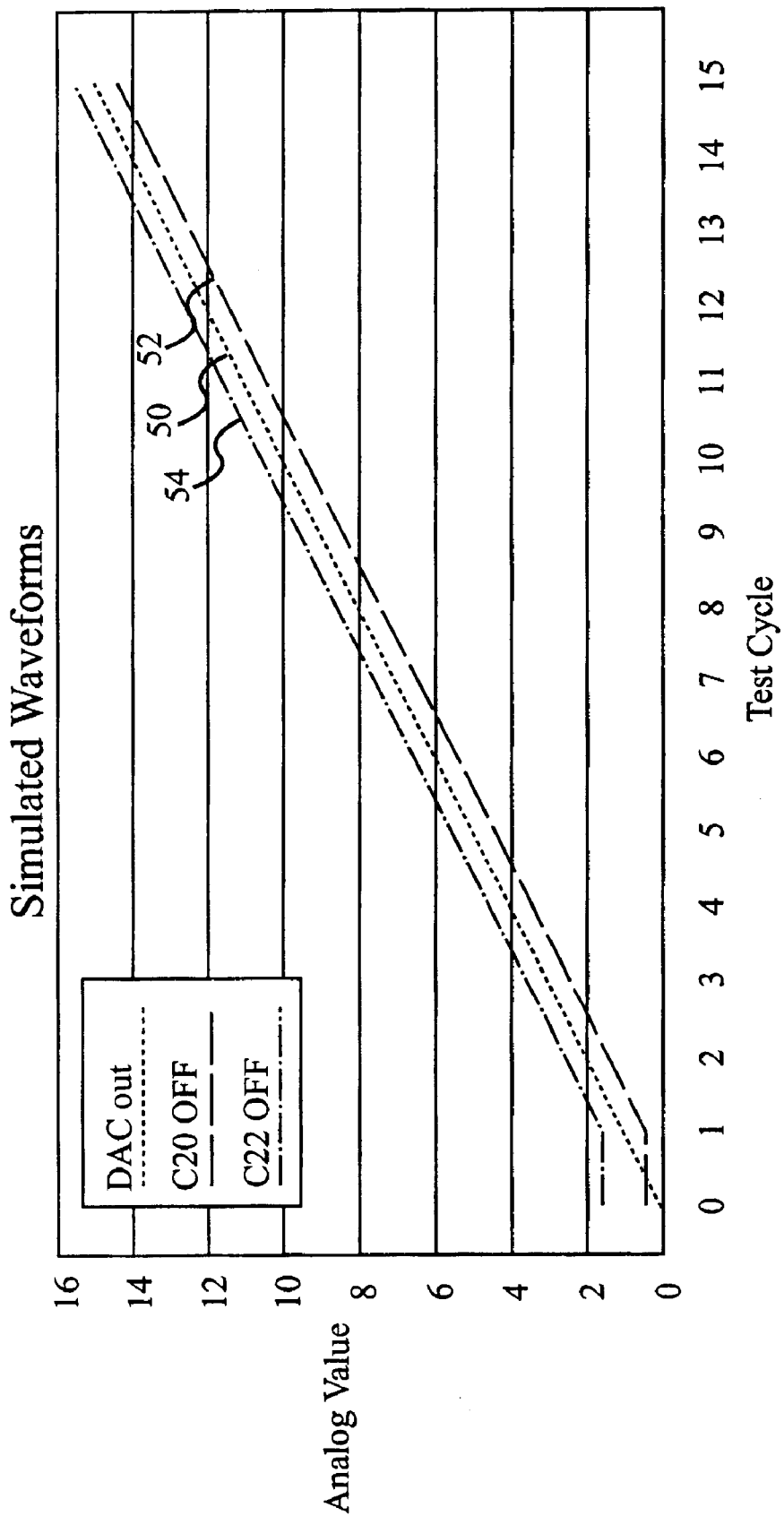
FIG. 4 is a graph plotting DAC output versus input code for a correctly-functioning DAC.

In FIG. 4, a line 50 represents the output value of DAC 14. This value is equal to the value that gets input at analog input 24. A line 52 represents the value detected by first plus (+) input 38 of comparator 20, taking into account the offset applied by comparator 20, and a line 54 represents the value detected by second minus (−) input 44 of second comparator 22, taking into account the offset applied by comparator 22.

Referring again to FIG. 5, the INPUT column contains consecutive numerals zero through 15, with a step size between successive rows equal to one. The data in this column are equivalent to those depicted by line 50 of FIG. 4, and represent voltage or other stimulus applied to analog input 24. The column labeled C20 OFF contains the value detected by first plus (+) input 38 of first comparator 20, including its offset, and is equivalent to line 52 of FIG. 4. The column labeled C22 OFF is equivalent to line 54, of FIG. 4, and contains the value detected by the second minus (−) input 44 of second comparator 22, including the offset. The C20-OUT and the C22-OUT columns represent, respectively, the output of comparators 20 and 22. In this example, a zero entry represents a pass reading for the part being tested, while a non-zero entry represents a failing reading. A slight variation of the circuit configuration may result in a non-zero corresponding to a pass condition. In FIG. 5, the only non-zero entry occurs on the first row of column C20-OUT. This "failing" reading may be disregarded since it occurs only because of the zero voltage applied to analog input 24 during the first test cycle: first minus (−) input 40 of first comparator 20 is thus artificially depressed below the value of first plus (+) input 38 for the first test cycle only. During subsequent test cycles, and assuming a properly functioning DAC, the magnitudes are reversed as expected.

The various values detected by test structure 10 will now be explained using the second row of FIG. 5 as an example. Recall that these values are representative of a properly functioning DAC. The INPUT column of the second row contains a one, corresponding to a stimulus of one volt on analog input 24. Sample and hold circuit 18 contains a value of zero volts because at this stage of the test cycle it is in the "hold" phase. This zero value from the previous cycle is read by first plus (+) input 38 of first comparator 20. When the offset of first comparator 20 is included, the value at input 38 becomes 0.5 volts, the number in column C20-OFF. The input voltage of one is meanwhile transferred, according to the circuitry of structure 10 as shown in FIG. 2, to first minus (−) input 40 of first comparator 20. The difference across inputs 38 and 40 is thus −0.5 volts and the C20-OUT column gives a zero reading.

Similarly, taking the same second row of FIG. 5, the one volt input gets passed to second plus (+) input 42 of second comparator 22. The value detected by inverting input 44 has passed through sample and hold circuit 18 and thus is equal to zero. After inclusion of the offset, the value becomes 1.5. This value is the number contained in the C22-OFF column. Here again, the difference across inputs 42 and 44 of second comparator 22 is (−0.5)â€"within the acceptable range assumed by this illustration. The C22-OUT column thus provides an output of zero, indicating a passing result.

Figure 6:
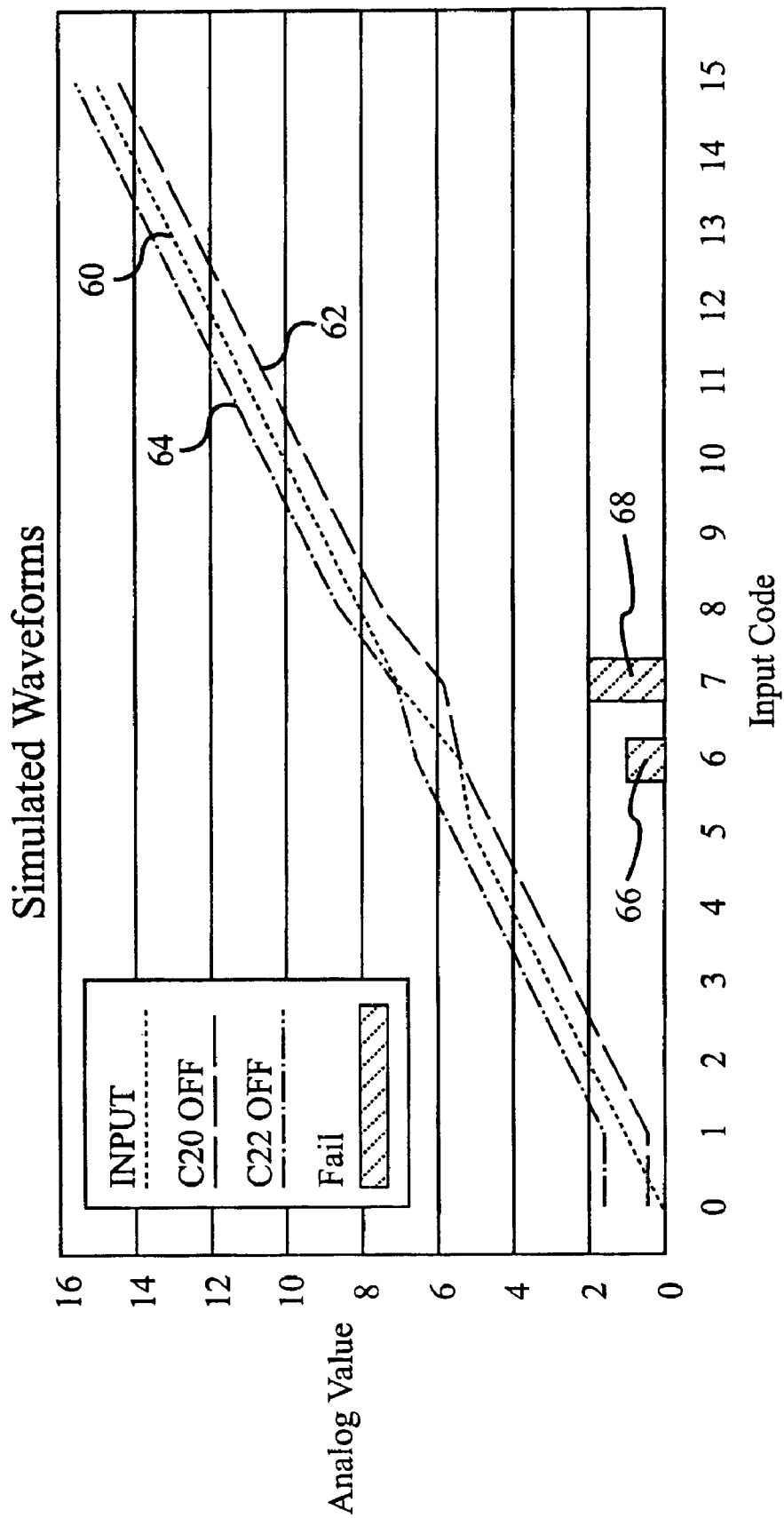
FIG. 6 is a graph plotting DAC output versus input code for a malfunctioning converter.

During testing, if one of the analog outputs from DAC 14 (corresponding to analog input 24) has more error than allowed by the offset of comparators 20 and 22, then comparators 20 and 22 will not maintain the expected data output pattern. This is illustrated by the waveforms and data in FIGS. 6 and 7. Lines 60, 62, and 64 in FIG. 6 represent, respectively, the input value from analog input 24, the value, offset included, at first plus (+) input 38, and the value, offset included, at second minus (−) input 44. Note that the input value of 5.4 should really be 6.0. Since the allowable error programmed into the comparator offsets is +/−0.5 and this indicates a −0.6 error it is flagged by comparators 20 and 22, as indicated by bars 66 and 68, as a pattern fail. For manufacturing, this is all that is necessary to screen a bad part.

More specifically, two test cycles give rise to the error indication. The first cycle is represented by the row having the value 5.4 in the INPUT column. Before running the test, of course, it is not known that that value is being read at analog input 24. Test structure 10 detects it as follows, with the general details being the same as in the discussion accompanying FIG. 5 above. In particular, as shown in the first of the two test cycles under discussion, first comparator 20 experiences a spread of +0.1 across inputs 38 and 40 (5.5 volts on input 38 and 5.4 volts on input 40). Because this is outside the acceptable error of +/−0.5, first digital output 26, represented by the C20-OUT column, returns a non-zero value. In the following row, having a seven in the INPUT column, second comparator 22 detects a spread of +0.1 across inputs 42 and 44 (7.0 volts on input 42 and 6.9 volts on input 44). As before, a non-zero reading for second digital output 28, represented in column C22-OUT, is the result.

Figure 8:
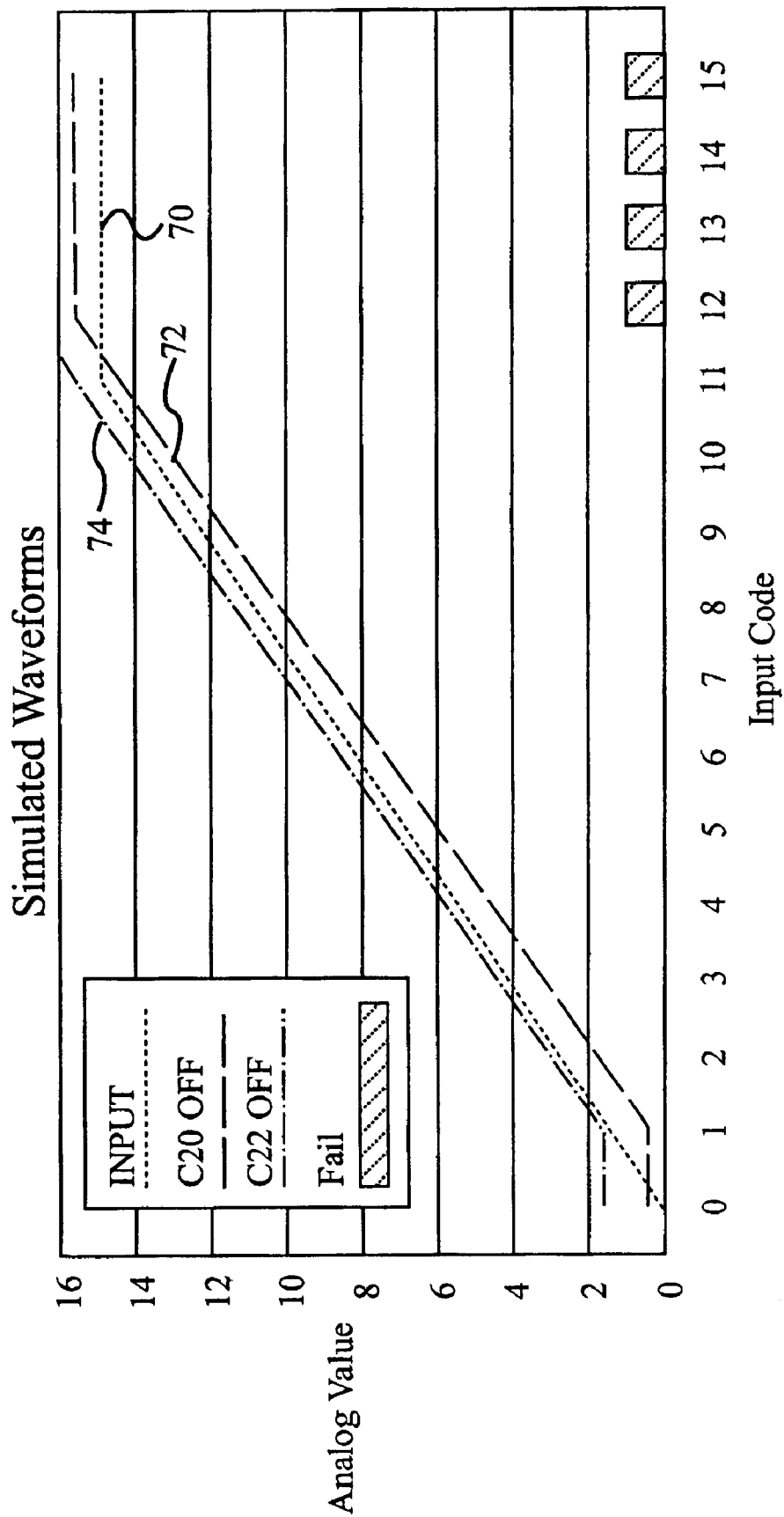
FIG. 8 is a graph illustrating simulated waveforms representative of positive gain error.
Figure 9:
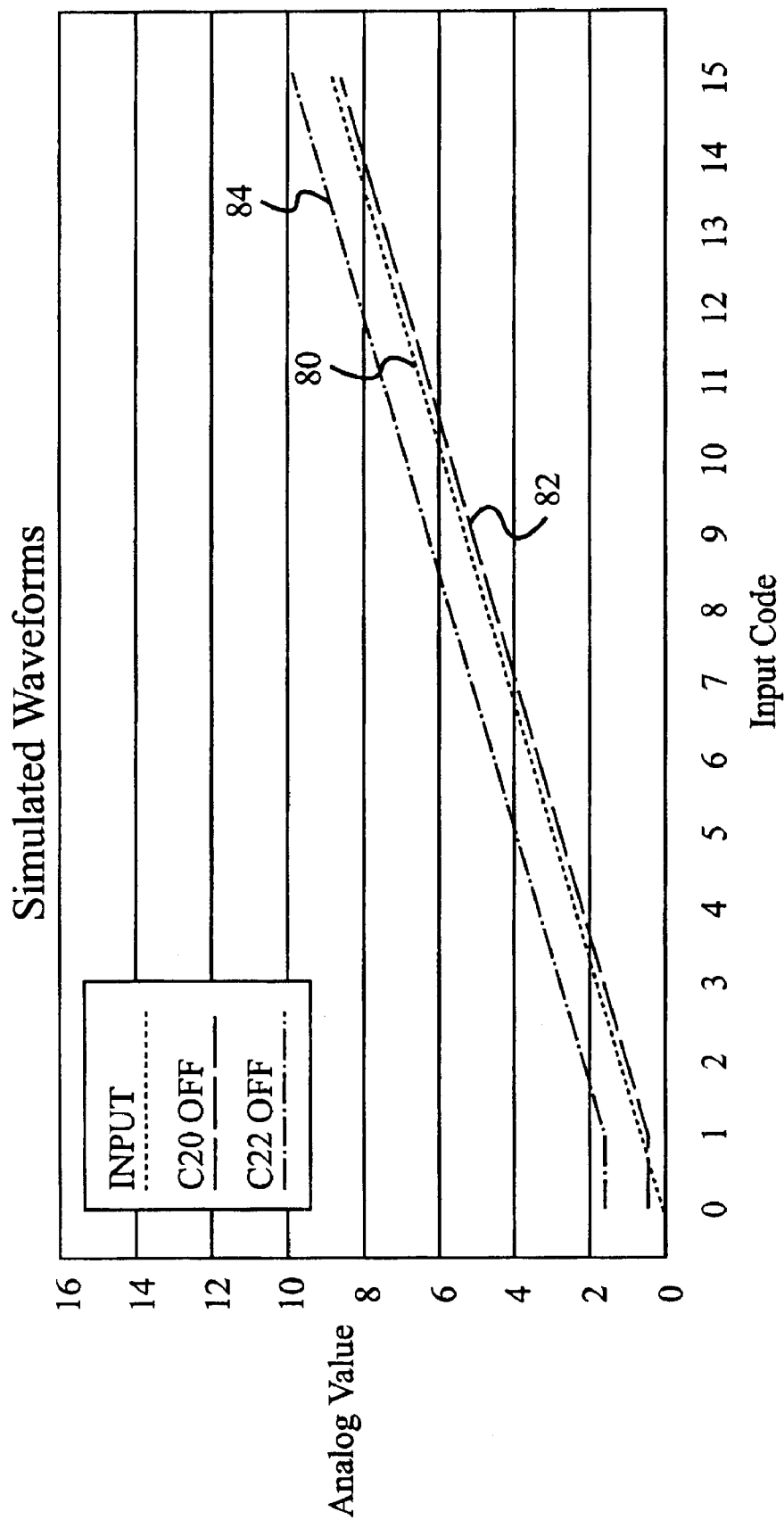
FIG. 9 is a graph illustrating simulated waveforms representative of negative gain error.

The present invention is well adapted to detect positive gain errors, as illustrated in FIG. 8, where a line 70 indicates the input seen at analog input 24, a line 72 represents the value, offset included, seen at first plus (+) input 38, and a line 74 represents the value, with offset included, seen at second minus (−) input 44. However, negative gain errors may be missed, as illustrated in FIG. 9, where lines 80, 82, and 84 correspond to lines 70, 72, and 74 of FIG. 8.

Figure 10:
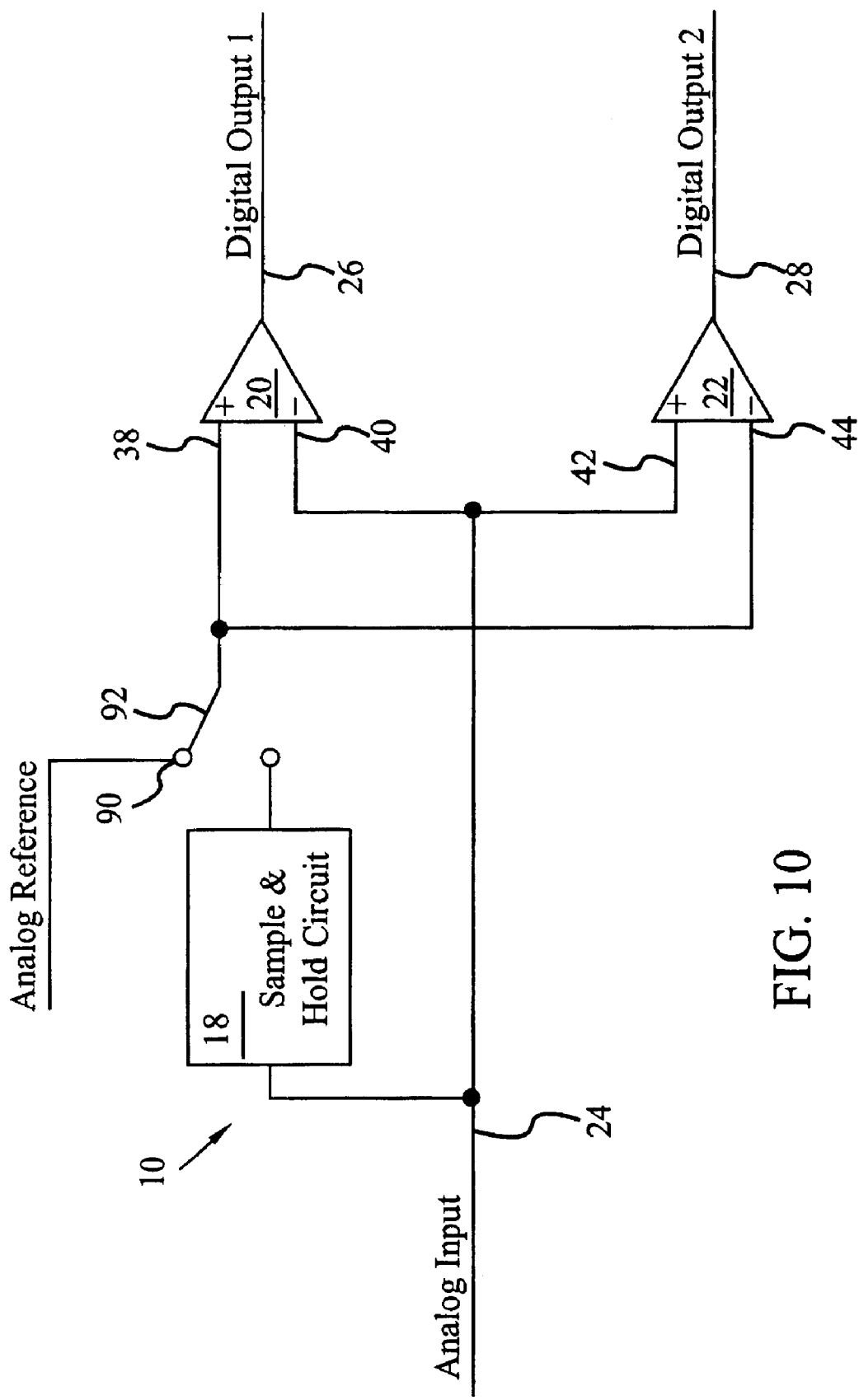
FIG. 10 is a view of an embodiment of the present invention adapted to detect negative gain errors.

This limitation may be overcome by making a single full scale reading using the tester PMU to verify circuit gain. Alternately, test structure 10 may be modified to include an analog reference 90 (see FIG. 10) used to verify full scale. This reference may be supplied by the tester, or it may be supplied by an on-chip circuit such as a Band Gap Reference. FIG. 10 illustrates an embodiment of the present invention showing the modification under discussion. A switch 92 may be controlled by BIST logic 16. In use, analog reference 90 may provide one or more test limits based on something other than the previous analog input. This could be used to solve the gain test problem described above, by designing the reference voltage to provide a full scale reference to comparators 20 and 22. The embodiment of FIG. 10 may also be used to improve the INL response of structure 10. The waveforms in FIG. 11, where lines 100, 102, and 104 correspond to lines 70, 72, and 74 of FIG. 8, and a line 106 represents the ideal response of DAC 14, illustrate the worst case INL that could be missed using the FIG. 10 embodiment.

Figure 11:
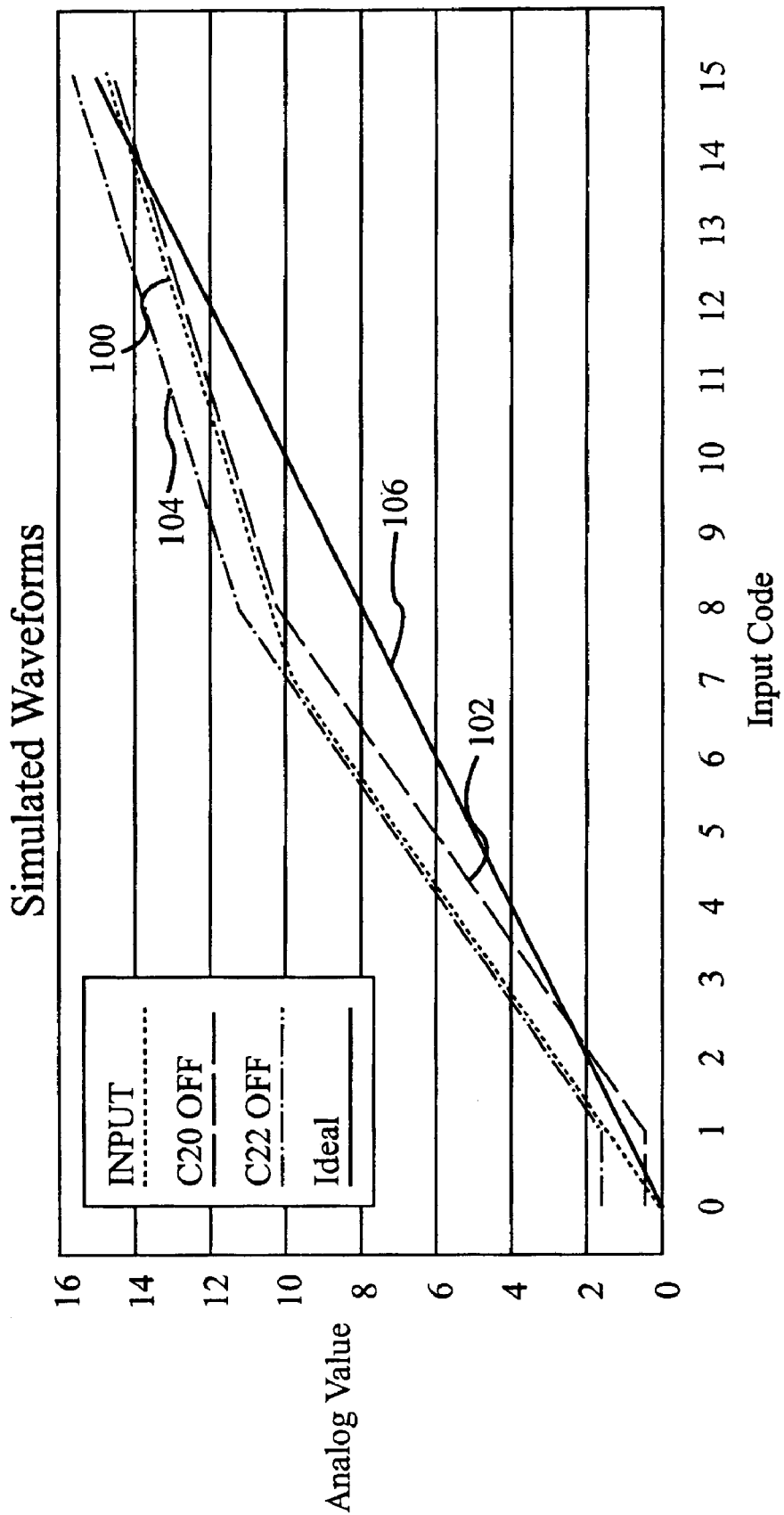
FIG. 11 is a graph illustrating simulated waveforms representative of a potential INL response of a DAC.

Note that the worst case INL error happens at code 8, in the FIG. 11 simulated example. To see this, compare the INPUT and Ideal lines. For this simulation, the magnitude of the error is 2.4 LSB. Also note that this error is "masked" by the dynamic nature of the pass/fail limit generation. Testing the INPUT against the analog reference at input code 8 would provide INL coverage by guaranteeing the actual signal is within an acceptable margin of the expected/ideal line. This method could be used at multiple strategic points in the transfer function to improve INL test coverage.

Figure 12:
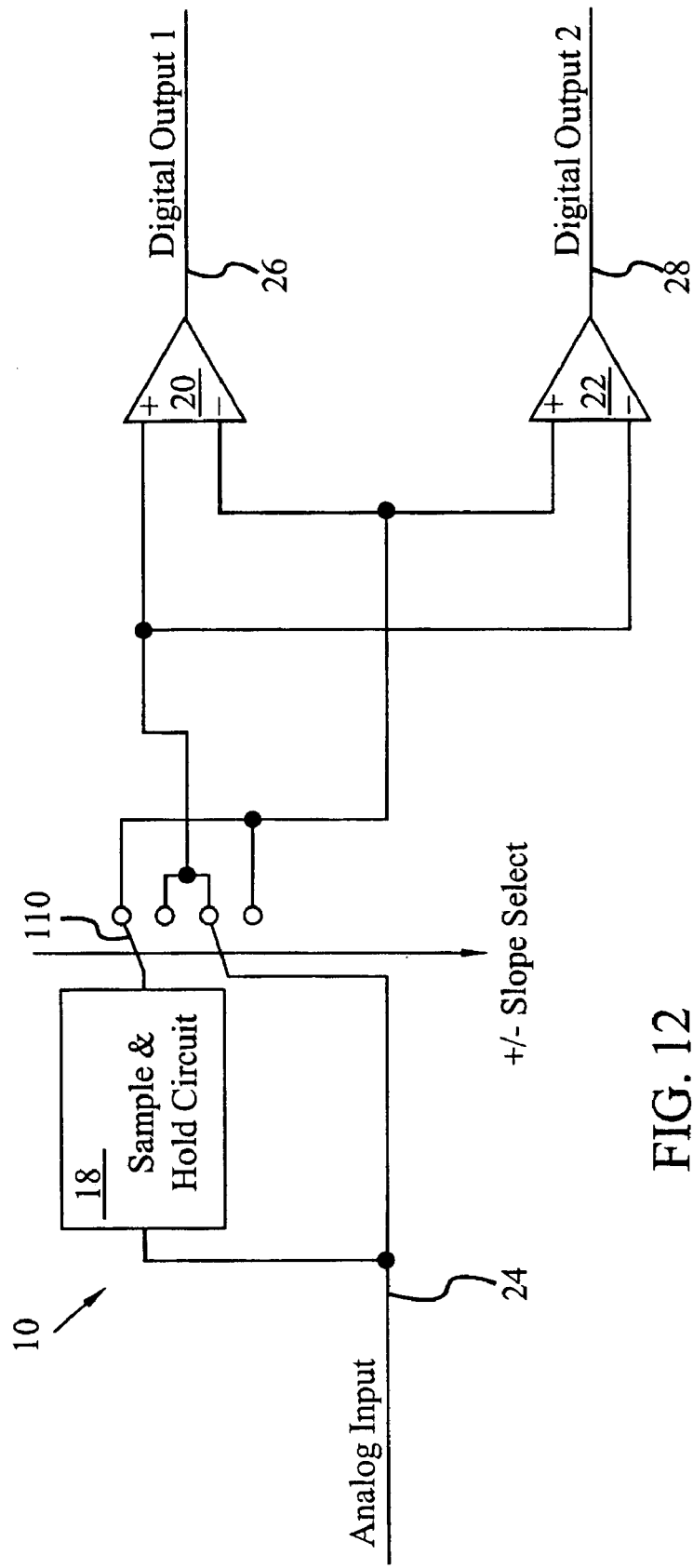
FIG. 12 is a view of an embodiment of the invention comprising a circuit adapted to test a linearly increasing or decreasing analog function.

In another embodiment of the present invention, structure 10 may have separate analog references 90 (and switches 92) for comparator 20 and comparator 22. This would allow using a different pass/fail margin for full scale and INL checks. Integrated test structure 10 may in another embodiment be modified to allow testing a linearly increasing or decreasing analog function by providing switches 110 as illustrated in FIG. 12.

The foregoing disclosure has described an integrated test structure to facilitate and speed manufacturing verification of microelectronic devices containing analog or mixed signal circuitry, such as a Digital to Analog Converter (DAC). The test circuitry and the DAC are placed on an integrated circuit along with digital logic, which is presumed to drive the input of the DAC. These inputs are translated, as a function of the DAC design, into an analog output. During manufacturing test, this analog output is measured in order to determine that the IC has been manufactured correctly. The analog input of the circuit is coupled to the analog output of the DAC. The digital output of the circuit is coupled to the digital logic on the IC. This configuration comprises a BIST structure. The invention allows BIST by eliminating the need to measure the analog output of the DAC external to the IC.

While the invention has been particularly shown and described with reference to specific embodiments thereof, it will be understood by those skilled in the art that various changes in form and details may be made therein without departing from the spirit and scope of the invention. For example, it will be understood that the circuit and measurement technique described herein is not limited to DAC testing. It can be used to test various analog nodes within an IC, with the limitation that during test, the analog node being tested must change by an equal magnitude with each successive test cycle.

What is claimed is:

1. A test structure adapted to test a microelectronic device, said test structure comprising:

(1) a first structure for sampling and holding a voltage;

(2) at least one second structure for summing at least one of a fixed offset voltage and a predetermined analog reference voltage to said held voltage, said at least one of a fixed offset voltage and a predetermined analog reference voltage representing at least one of an upper error bound and a lower error bound of said test;

(3) the at least one second structure further for comparing said summed voltage to a voltage to be tested, said second structure responsive to the two voltages to produce a digital output;

(4) a clocking structure coupled to said first structure and coupled to said second structure; and (5) a logic structure coupled to said digital outputs of said second structure.

2. A test structure adapted to test a microelectronic device, said test structure comprising:

a sample and hold circuit;

a sample and hold clock, coupled to the sample and hold circuit;

a first comparator with a first at least one of an analog reference and a fixed offset representing a first error bound and at least a first input coupled to an output of said microelectronic device; and a second comparator with a second at least one of an analog reference and a fixed offset representing a second error bound and at least a second input coupled to said output of said microelectronic device;

said test structure responsive to outputs of said first comparator and said second comparator to generate real time pass/fail indicators.

3. The test structure of claim 2 wherein said test structure is located on an integrated circuit containing said microelectronic device.

4. The test structure of claim 2 further comprising at least a third comparator having a third fixed internal offset and at least a third input, said third input coupled to said output of said microelectronic device.

5. The test structure of claim 2, wherein the first at least one of an analog reference and an offset comprises a different at least one of an analog reference and an offset from said second at least one of an analog reference and an offset.

6. A test structure for testing a microelectronic device, said test structure comprising: (1) a first test structure input; (2) a first comparator having a first plus (+) input, a first minus (−) input, a first internal offset and a first digital output, said first plus (+) input coupled to an output of a sample and hold circuit, said sample and hold circuit coupled to said first test structure input, said first minus (−) input coupled to said first test structure input; and (3) a second comparator having a second plus (+) input, a second minus (−) input, a second internal offset and a second digital output, said second minus (−) input coupled to said output of said sample and hold circuit, said sample and hold circuit coupled to said first test structure input, said second plus (+) input coupled to said first test structure input.

7. The test structure of claim 6 wherein said first comparator is configured to return a first reading at said first digital output, and wherein said second comparator is configured to return a second reading at said second digital output, said first and second readings representative of the performance of said microelectronic device.

8. The test structure of claim 6 wherein said test structure is located on an integrated circuit containing said microelectronic device.

9. The test structure of claim 8 wherein said integrated circuit contains digital logic, said test structure coupled between a digital to analog converter to be tested and said digital logic on said integrated circuit.

10. The test structure of claim 6 wherein said sample and hold circuit is level sensitive and configured to sample when a sample and hold clock is in an active state and to hold when said sample and hold clock is not in an active state.

11. The test structure of claim 6 further comprising at least one analog reference coupled to at least one of said first and second comparators.

12. The test structure of claim 11 wherein said analog reference comprises a switch coupled to said output of said sample and hold circuit, said switch capable of disengaging said sample and hold circuit.

13. The test structure of claim 11 wherein said at least one analog reference comprises a first analog reference coupled to said first comparator and a second analog reference coupled to said second comparator.

14. The test structure of claim 13, wherein at least one of the first analog reference and the second analog reference comprises a non-linear reference.

15. The test structure of claim 14, wherein the first analog reference comprises a first nonlinear reference and the second analog reference comprises a second nonlinear reference, wherein said first nonlinear reference comprises a different nonlinear reference from said second nonlinear reference.

16. The test structure of claim 11, wherein the analog reference comprises a non-linear reference.

17. The test structure of claim 6 further comprising at least one switch coupled to at least one of said first and second comparators, said switch allowing said test structure to test linearly increasing or linearly decreasing analog functions.

18. The test structure of claim 17 wherein said at least one switch comprises a first switch and a second switch, said first and second switches coupled to said sample and hold circuit and said first and second comparators.

19. The test structure of claim 6 further comprising at least a third comparator having a third fixed internal offset and at least a third input, said third input coupled to said output of said sample and hold circuit.

20. The test structure of claim 6, wherein said test structure is located on an integrated circuit containing said microelectronic device, wherein said sample and hold circuit is a level-sensitive sample and hold circuit, and wherein said first comparator is configured to return a first reading at said first digital output, and wherein said second comparator is configured to return a second reading at said second digital output, said first and second readings representative of the performance of said microelectronic device.

21. The test structure of claim 20 further comprising at least a third comparator having a third internal offset and at least a third input, said third input coupled to said output of said sample and hold circuit.

22. A test structure for testing a microelectronic device, said test structure comprising:

(1) a first test structure input;

(2) a first comparator having a first plus (+) input, a first minus (−) input, a first internal offset and a first digital output, said first plus (+) input coupled to an output of at least one switch, the at least one switch operable to select between at least one of an analog reference, a sample and hold circuit, and a slope polarity, said sample and hold circuit coupled to said first test structure input, said first minus (−) input coupled to at least one of said first test structure input and at least one switch, the at least one switch operable to select between at least one of an analog reference, said sample and hold circuit, and a slope polarity; and (3) a second comparator having a second plus (+) input, a second minus (−) input, a second internal offset and a second digital output, said second minus (−) input coupled to said output of at least one switch, the at least one switch operable to select between at least one of an analog reference, said sample and hold circuit, and a slope polarity, said sample and hold circuit coupled to said first test structure input, said second plus (+) input coupled to at least one of said first test structure input and at least one switch, the at least one switch operable to select between at least one of an analog reference, said sample and hold circuit, and a slope polarity.

* * * * *